United States Patent
Yang et al.

(10) Patent No.: US 12,424,422 B2
(45) Date of Patent: Sep. 23, 2025

(54) PLASMA PROCESSING APPARATUS AND SEMICONDUCTOR DEVICE MANUFACTURING METHOD

(71) Applicant: SAMSUNG ELECTRONICS CO., LTD., Suwon-si (KR)

(72) Inventors: Wonsuk Yang, Hwaseong-si (KR); Sanghun Seo, Yongin-si (KR); Seunghyun Chung, Yongin-si (KR); Myoungsoo Kim, Hwaseong-si (KR); Seunghun Seo, Yongin-si (KR); Woojin Song, Yongin-si (KR); Bora Yoon, Goyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 666 days.

(21) Appl. No.: 17/817,338

(22) Filed: Aug. 3, 2022

(65) Prior Publication Data
US 2023/0207292 A1   Jun. 29, 2023

(30) Foreign Application Priority Data
Dec. 29, 2021   (KR) .................. 10-2021-0190720

(51) Int. Cl.
*H01J 37/32* (2006.01)
*C23C 16/455* (2006.01)
(Continued)

(52) U.S. Cl.
CPC .. *H01J 37/32834* (2013.01); *C23C 16/45591* (2013.01); *C23C 16/505* (2013.01);
(Continued)

(58) Field of Classification Search
CPC .............. C23C 16/345; C23C 16/4408; C23C 16/4412; C23C 16/45565;
(Continued)

(56) References Cited

U.S. PATENT DOCUMENTS 5,401,350 A * 3/1995 Patrick .................. H01J 37/321
204/298.34
5,476,182 A 12/1995 Ishizuka et al.
(Continued)

FOREIGN PATENT DOCUMENTS

| KR | 10-0282462 | 6/2001 |
| KR | 10-1151223 | 6/2012 |
| KR | 10-1246191 | 3/2013 |

*Primary Examiner* — Benjamin Kendall
(74) *Attorney, Agent, or Firm* — Morgan, Lewis & Bockius LLP

(57) ABSTRACT

A plasma processing apparatus includes a chamber having an upper wall with a plurality of through holes and a lower wall with an exhaust hole, the chamber defining a plasma processing space; a substrate stage disposed within the chamber, the substrate stage having a seating surface, wherein a substrate is seated on the seating surface; a baffle plate disposed between the upper wall and the substrate stage, the baffle plate having gas distribution holes; a gas supply configured to supply gas into the chamber through the through holes; a pumping device having an exhaust pipe, the exhaust pipe connected to the exhaust hole to control pressure inside the chamber; and a plasma generator configured to generate a first plasma using the gas supplied into the chamber through at least one of the through holes formed in the upper wall.

19 Claims, 11 Drawing Sheets

(51) Int. Cl.
*C23C 16/505* (2006.01)
*H01L 21/02* (2006.01)

(52) U.S. Cl.
CPC ....... *H01J 37/3211* (2013.01); *H01J 37/3244* (2013.01); *H01J 37/32458* (2013.01); *H01J 37/32669* (2013.01); *H01L 21/02274* (2013.01); *H01J 2237/18* (2013.01); *H01J 2237/3321* (2013.01)

(58) Field of Classification Search
CPC .......... C23C 16/45591; C23C 16/4584; C23C 16/505; C23C 16/507; H01J 37/321; H01J 37/3211; H01J 37/3244; H01J 37/32449; H01J 37/32458; H01J 37/32633; H01J 37/3266; H01J 37/32669; H01J 37/32834; H01J 2237/18; H01J 2237/3321; H01L 21/02126; H01L 21/02211; H01L 21/02274

See application file for complete search history.

(56) References Cited

U.S. PATENT DOCUMENTS

| | | | | |
|---|---|---|---|---|
| 5,726,413 | A | * | 3/1998 | Baenziger ................ H05H 1/46 219/121.52 |
| 5,767,628 | A | | 6/1998 | Keller et al. |
| 6,471,822 | B1 | | 10/2002 | Yin et al. |
| 8,179,050 | B2 | | 5/2012 | Chen |
| 9,066,413 | B2 | * | 6/2015 | Chang ................... H01J 37/321 |
| 9,215,789 | B1 | | 12/2015 | Hala et al. |
| 9,299,536 | B2 | | 3/2016 | Biloiu |
| 9,734,990 | B2 | | 8/2017 | Chang et al. |
| 2002/0069827 | A1 | * | 6/2002 | Sakamoto ............. C23C 16/482 118/723 I |
| 2008/0236491 | A1 | * | 10/2008 | Brcka ................ H01J 37/3244 118/723 I |
| 2011/0133650 | A1 | * | 6/2011 | Kim ...................... H01J 37/321 315/111.21 |
| 2014/0292193 | A1 | * | 10/2014 | Chang ................. H01J 37/3211 315/34 |
| 2015/0371823 | A1 | * | 12/2015 | Eom ........................ H05H 1/46 118/723 R |
| 2018/0174801 | A1 | * | 6/2018 | Chen ................ H01J 37/32183 |

* cited by examiner

PLASMA PROCESSING APPARATUS AND SEMICONDUCTOR DEVICE MANUFACTURING METHOD

CROSS-REFERENCE TO THE RELATED APPLICATION

This application claims priority under 35 U.S.C. § 119 to Korean Patent Application No. 10-2021-0190720, filed on Dec. 29, 2021, in the Korean Intellectual Property Office (KIPO), the disclosure of which is herein incorporated by reference in its entirety.

TECHNICAL FIELD

Example embodiments relate to a plasma processing apparatus and semiconductor device manufacturing method. More particularly, example embodiments relate to a plasma processing apparatus using inductively coupled plasma and a semiconductor device manufacturing method using the same.

DESCRIPTION OF THE RELATED ART

In a semiconductor manufacturing process, an atomic layer deposition (ALD) method is performed to form a deposition film on a semiconductor substrate. As a degree of integration of semiconductor devices increases, in order to control a deposition rate of the deposition film and to deposit a high purity deposition layer, a plasma processing apparatus having a high density at low pressure may be required. However, in a case of a conventional inductively coupled plasma (ICP) device, it may be difficult to generate the high density plasma at pressure of several tens of mTorr or higher, and generate the high density plasma at low pressure of several mTorr. Accordingly, there is a problem in that a low pressure process and a high pressure process cannot be performed in-situ in one vacuum chamber.

In a semiconductor manufacturing process, the upper and lower magnets provided in a chamber may generate a whistler phenomenon rotating in a magnetic field when the plasma for reactive gas is generated. Since a pumping device and a baffle plate provided in the chamber control the pressure inside the chamber within a wide range during a process, even at low pressure, a high-quality deposition layer may be formed by generating high density and high ionized helicon plasma.

SUMMARY

According to some example embodiments, a plasma processing apparatus includes a chamber having an upper wall and a lower wall, the upper wall having a plurality of through holes formed therein and the lower wall having an exhaust hole formed therein, where the chamber defines a plasma processing space between the upper wall and the lower wall; a substrate stage disposed within the chamber, the substrate stage having a seating surface, wherein a substrate is seated on the seating surface; a baffle plate disposed between the upper wall and the substrate stage, the baffle plate having a plurality of gas distribution holes formed therein; a gas supply configured to supply gas into the chamber through at least one of the through holes formed in the upper wall; a pumping device having an exhaust pipe, the exhaust pipe connected to the exhaust hole to control pressure inside the chamber; and a plasma generator configured to generate a first plasma using the gas supplied into the chamber through at least one of the through holes formed in the upper wall.

According to some example embodiments, a plasma processing apparatus includes a chamber having an upper wall and a lower all, the upper wall having a plurality of through holes formed therein and the lower wall having an exhaust hole formed therein, wherein the chamber defines a plasma processing space between the upper wall and the lower wall; a substrate stage disposed within the chamber, the substrate stage having a seating surface for supporting a substrate; a baffle plate disposed between the upper wall and the substrate stage, the baffle plate having a plurality of gas distribution holes formed therein; a gas supply configured to supply gas into the chamber through at least one of the through holes formed in the upper wall; a pumping device having an exhaust pipe, the exhaust pipe connected to the exhaust hole to control pressure inside the chamber; a plurality of first dielectric tubes respectively disposed on a plurality of first through holes, wherein the first through holes are symmetrically disposed on a first plane in a circumferential direction with respect to a center of the chamber; a second dielectric tube disposed on a second through hole, wherein the second through hole is disposed at the center of the chamber; a plurality of upper magnets vertically spaced apart from the first dielectric tubes, the plurality of upper magnets disposed on the first plane; a plurality of lower magnets disposed to respectively correspond to a plurality of the upper magnets on a second plane between the plurality of first dielectric tubes and the plurality of upper magnets on the upper wall; a plurality of first antennas respectively mounted on the plurality of first dielectric tubes; a second antenna mounted on the second dielectric tube; and a power supply configured to supply first power to the first antennas and second power to second antennas, wherein a value of an area of an outlet end portion of the exhaust pipe is equal to a value of a total area of the gas distribution holes of the baffle plate.

According to some example embodiments, a plasma processing apparatus includes a chamber having an upper wall and a lower wall, the upper wall having a plurality of through holes formed therein and the lower wall having an exhaust hole formed therein, wherein the chamber defines a plasma processing space between the upper wall and the lower wall; a substrate stage disposed within the chamber, the substrate stage having a seating surface for supporting a substrate; a baffle plate disposed between the upper wall and the substrate stage, the baffle plate having a plurality of gas distribution holes formed therein; a gas supply configured to supply gas into the chamber through at least one of the through holes formed in the upper wall; a pumping device having an exhaust pipe, the exhaust pipe connected to the exhaust hole to control pressure inside the chamber; a plurality of first dielectric tubes respectively disposed on a plurality of first through holes, wherein the first through holes are on a first plane and are symmetrically disposed in a circumferential direction with respect to a center of the chamber; a second dielectric tube disposed on a second through hole, wherein the second through hole is disposed at the center of the chamber; a plurality of upper magnets vertically spaced apart from the first dielectric tubes, the plurality of upper magnets disposed on the first plane; a plurality of lower magnets disposed on a second plane between the plurality of first dielectric tubes and the plurality upper magnets on the upper wall; a plurality of first antennas respectively mounted on the plurality of first dielectric tubes; a second antenna mounted on the second dielectric tube; a first radio frequency (RF) power source configured to supply first power to the first antennas; a second RF power source configured to supply second power to the second antenna; and a first power distributor disposed between the first antennas and the first RF power source to distribute to the first antennas the first power supplied by the first RF power source, wherein a value of an area of an outlet end portion of the exhaust pipe is the same as a value of a total area of the gas distribution holes of the baffle plate are same, and the pumping device is configured to control the pressure inside the chamber to be within a range of about 0.1 mTorr to about 1 Torr.

According to example embodiments, in a semiconductor device manufacturing method, a precursor source is supplied on a semiconductor substrate, the semiconductor substrate disposed inside a chamber for defining a plasma processing space. A first purging gas is supplied for removing residual precursor source remaining in air in the chamber. A reactive gas is supplied for reacting with the precursor source. Pressure inside the chamber is lowered to a preset pressure, and plasma is formed. A deposition layer is formed by reacting the precursor source with the reactive gas. A second purging gas is supplied for removing a residual material remaining in the air in the chamber. The preset pressure is within a range of about 0.1 mTorr to about 10 mTorr.

According to example embodiments, a plasma processing apparatus may include a chamber having an upper wall with a plurality of through holes formed therein and a lower wall with an exhaust hole formed therein, the chamber defining a plasma processing space between the upper wall and the lower wall, a substrate stage within the chamber and having a seating surface on which a substrate is seated, a baffle plate disposed between the upper wall of the chamber and the substrate stage, the baffle plate having a plurality of gas distribution holes formed therein, a gas supply configured to supply gas into the chamber through at least some of the through holes formed in the upper wall of the chamber, a pumping device having an exhaust pipe connected to the exhaust hole to control pressure inside the chamber, and a plasma generator configured to generate a first plasma from the gas supplied through at least some of the through holes formed in the upper wall of the chamber.

Thus, the upper and lower magnets disposed in the chamber may generate a whistler phenomenon rotating in a magnetic field when the plasma for reactive gas is generated. Since the pumping device and the baffle plate disposed in the chamber control the pressure inside the chamber within a wide range during a process, even at low pressure, a high-quality deposition layer may be formed by generating high density and high ionized helicon plasma.

BRIEF DESCRIPTION OF THE DRAWINGS

Example embodiments will be more clearly understood from the following detailed description taken in conjunction with the accompanying drawings.

DETAILED DESCRIPTION OF EXAMPLE EMBODIMENTS

Hereinafter, example embodiments will be explained in detail with reference to the accompanying drawings.

Figure 1:
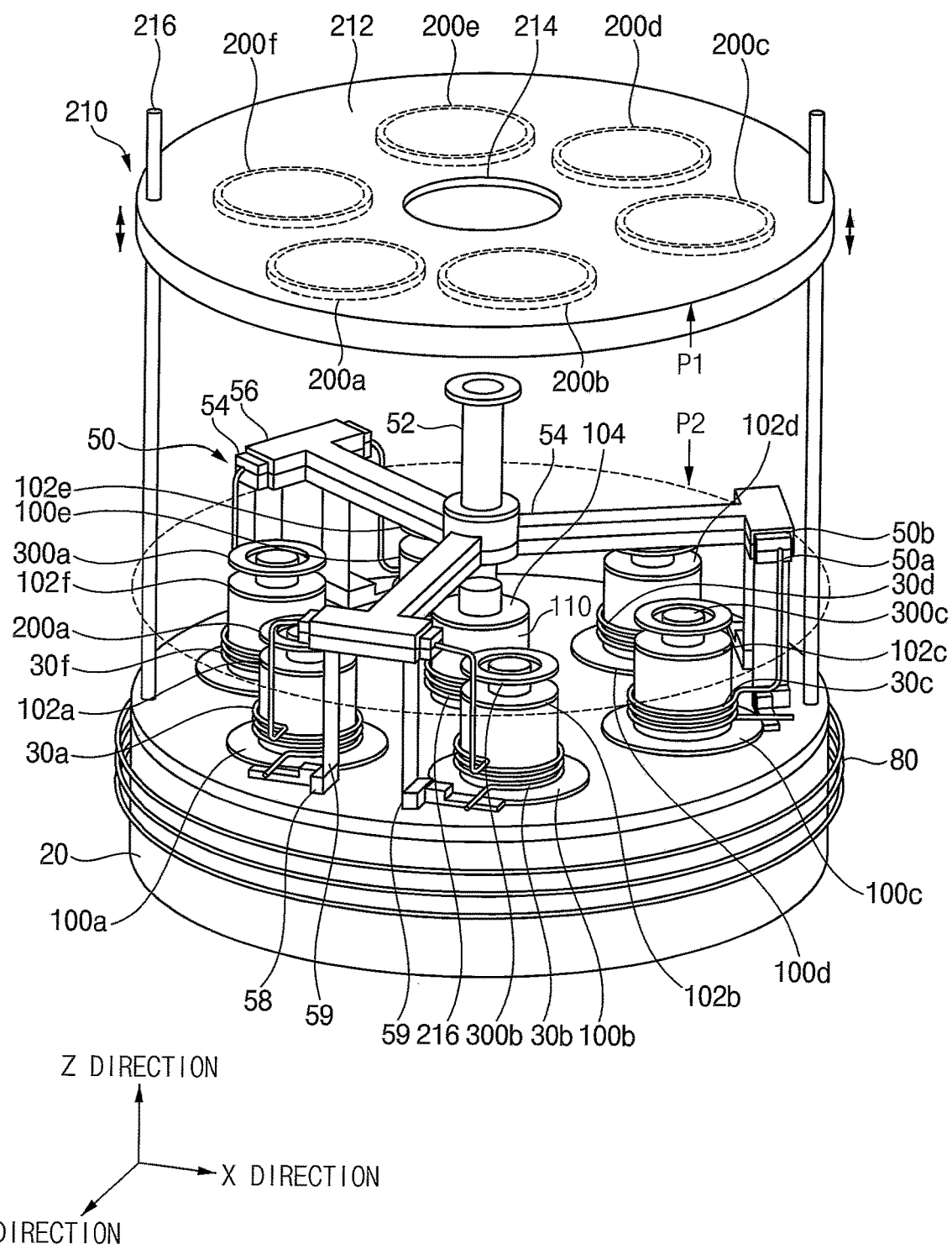
FIG. 1 is a perspective view illustrating a plasma processing apparatus in accordance with example embodiments.
Figure 2:
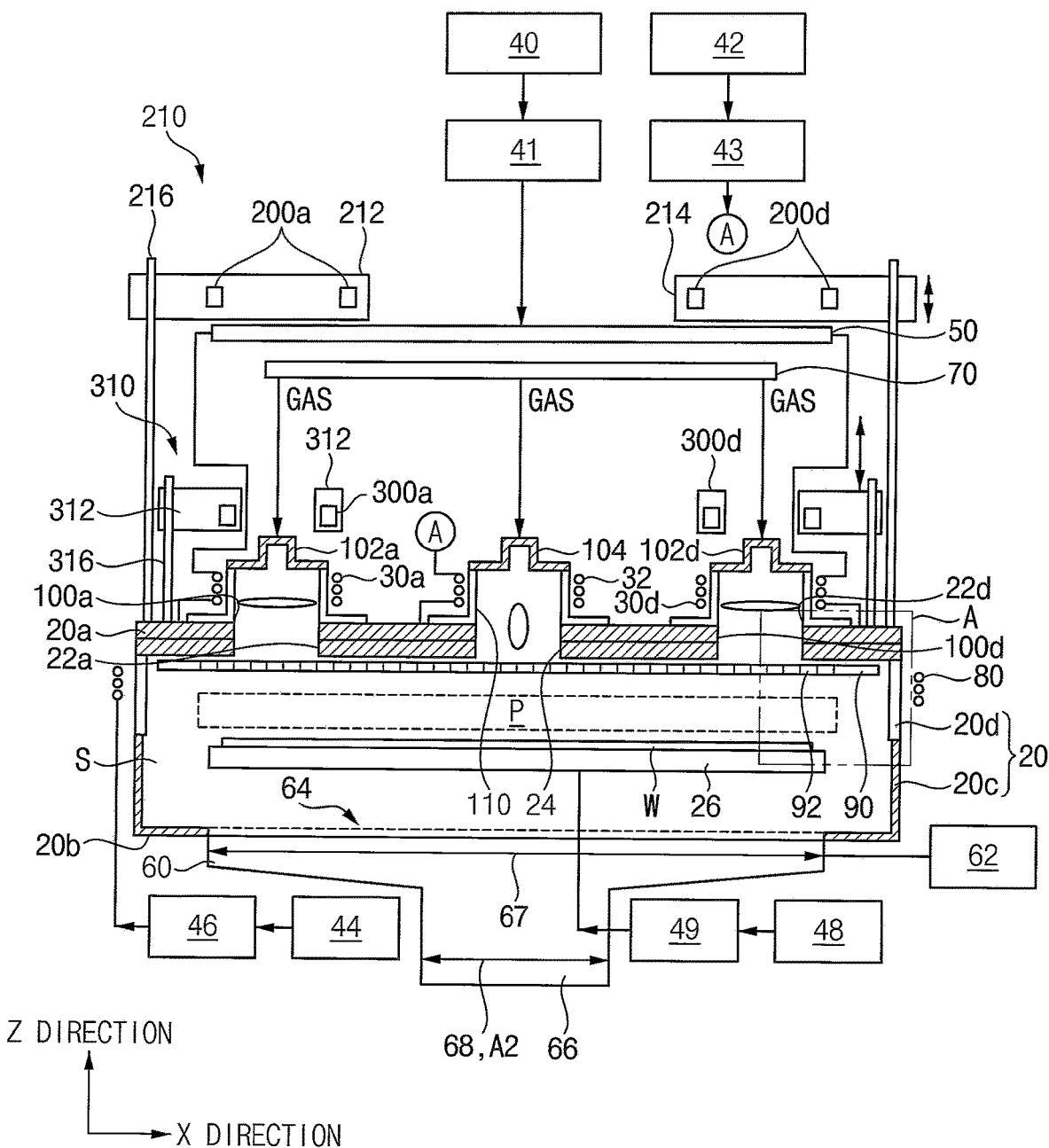
FIG. 2 is a cross-sectional view illustrating the plasma processing apparatus in FIG. 1.
Figure 3:
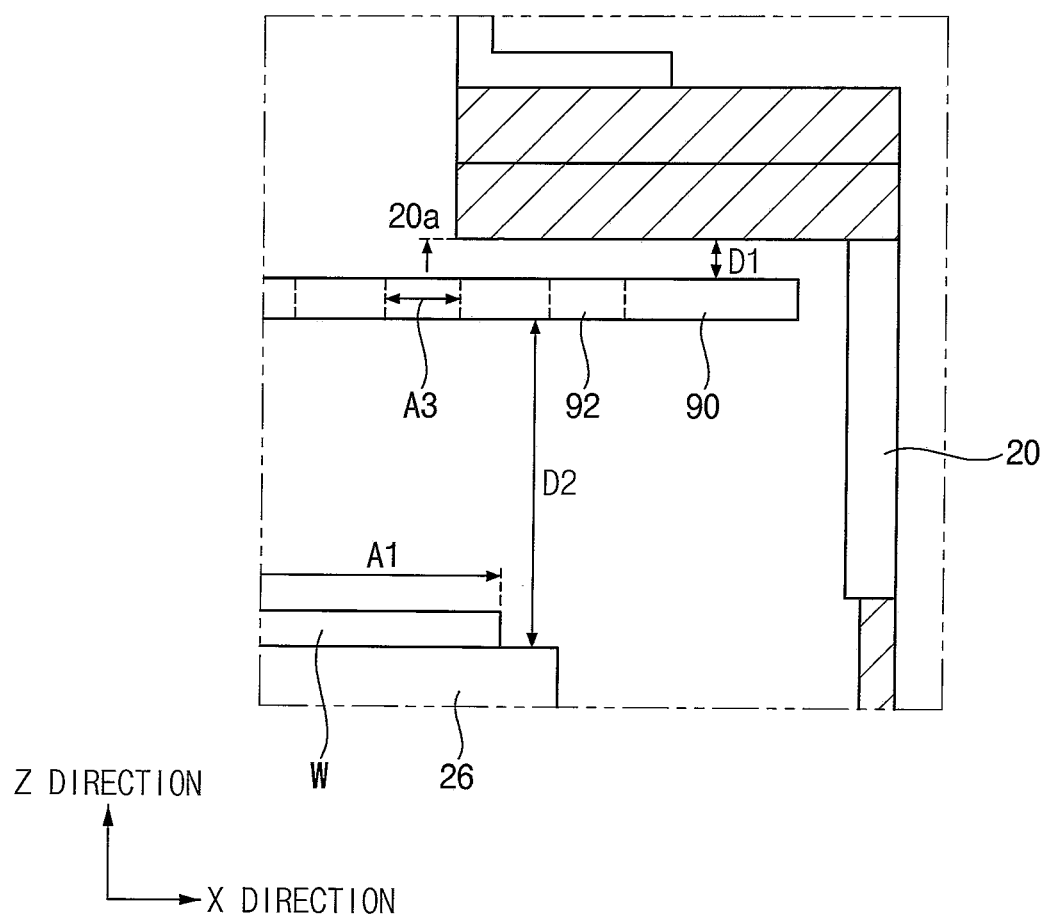
FIG. 3 is an enlarged cross-sectional view illustrating the portion 'A' in FIG. 2.
Figure 4:
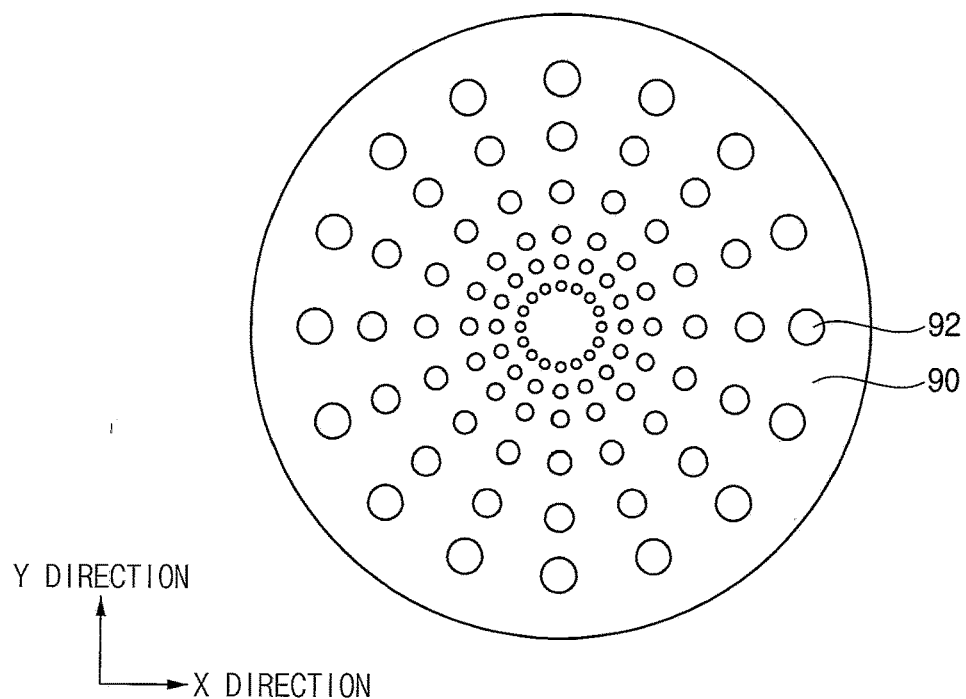
FIG. 4 is a plan view illustrating a baffle plate in FIG. 1.
Figure 5:
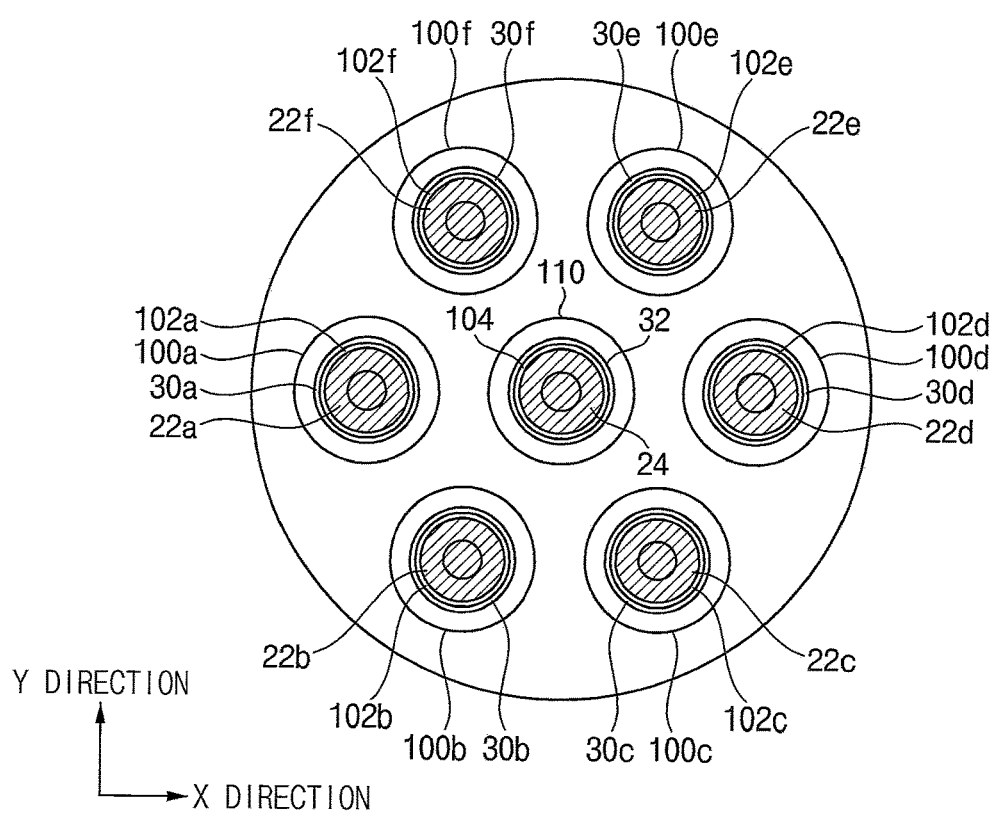
FIG. 5 is a plan view illustrating dielectric tubes in FIG. 1.
Figure 6:
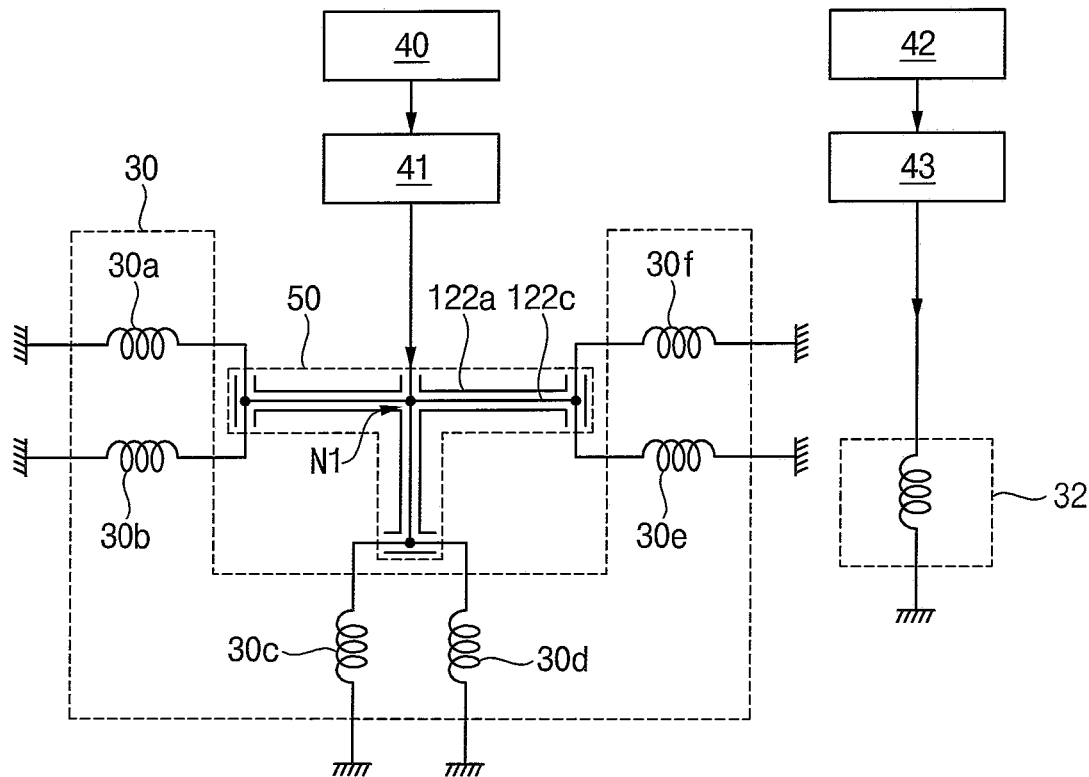
FIG. 6 is a circuit diagram illustrating the plasma processing apparatus in FIG. 1.
Figure 7:
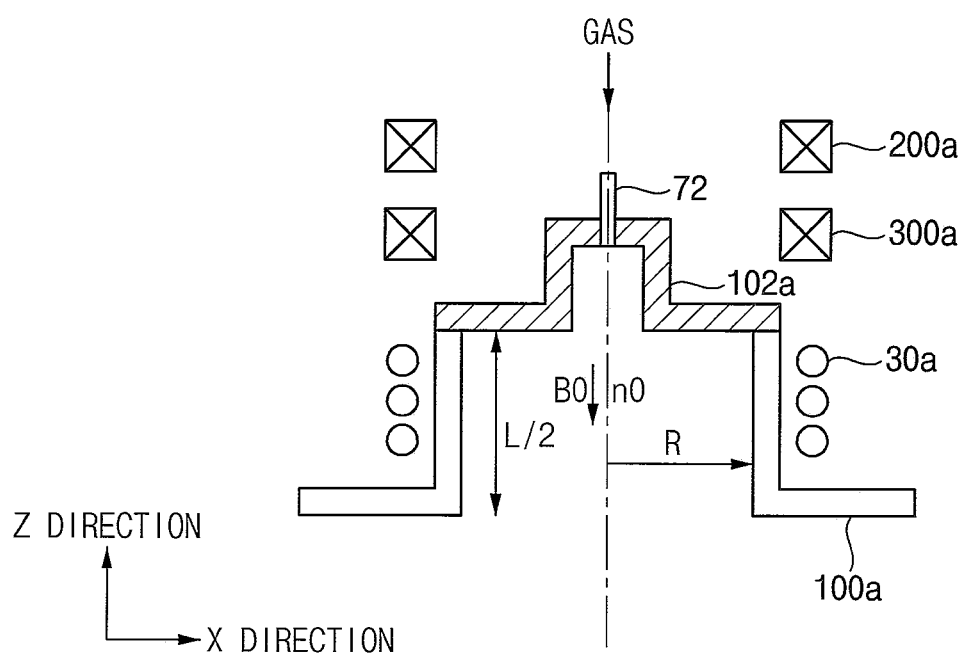
FIG. 7 is a cross-sectional view illustrating a portion of a dielectric tube in FIG. 1.
Figure 8:
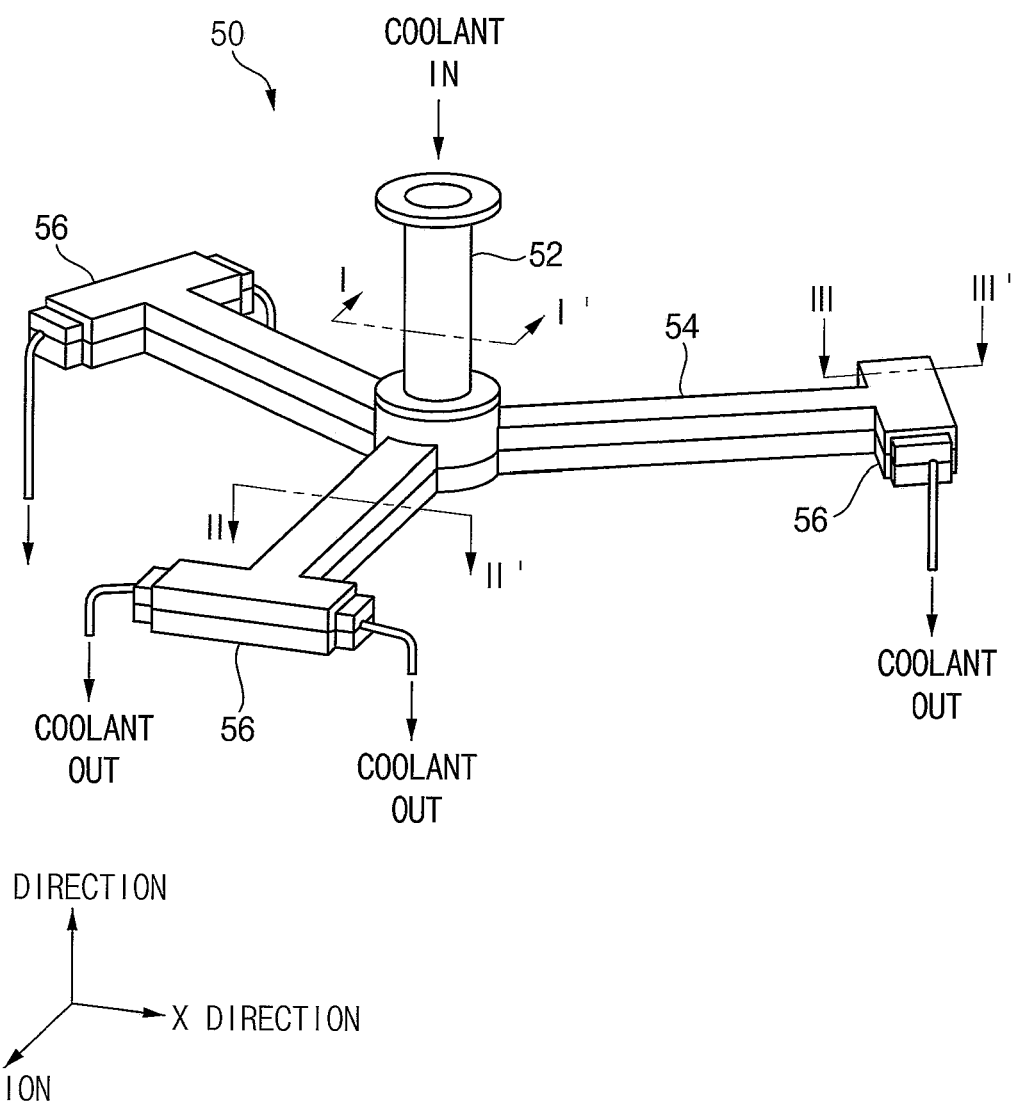
FIG. 8 is a perspective view illustrating a power distributor in FIG. 1.
Figure 9:
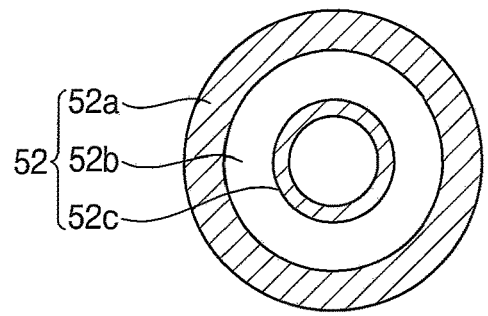
FIG. 9 is a cross-sectional view taken the along line I-I' in FIG. 8.
Figure 10:
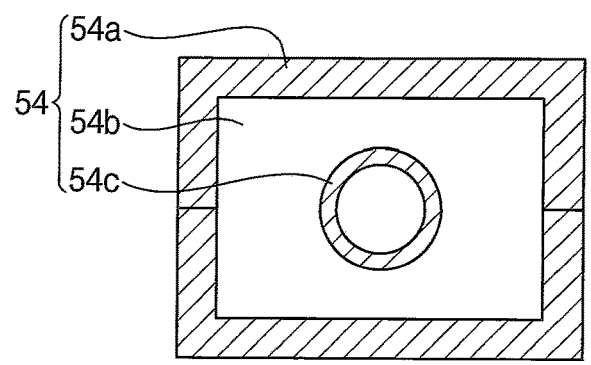
FIG. 10 is a cross-sectional view taken the along line II-II' in FIG. 8.
Figure 11:
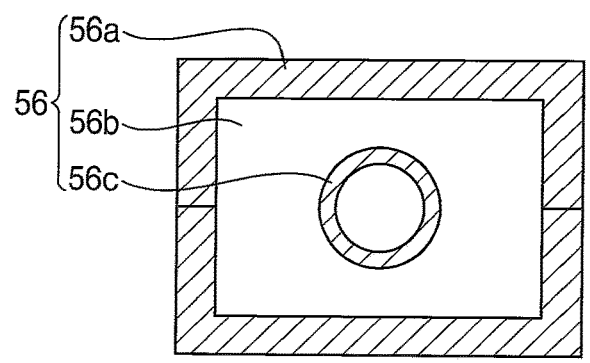
FIG. 11 is a cross-sectional view taken the along line III-III' in FIG. 8.

FIG. 1 is a perspective view illustrating a plasma processing apparatus in accordance with example embodiments. FIG. 2 is a cross-sectional view illustrating the plasma processing apparatus in FIG. 1. FIG. 3 is an enlarged cross-sectional view illustrating the portion 'A' in FIG. 2. FIG. 4 is a plan view illustrating a baffle plate in FIG. 1. FIG. 5 is a plan view illustrating dielectric tubes in FIG. 1. FIG. 6 is a circuit diagram illustrating the plasma processing apparatus in FIG. 1. FIG. 7 is a cross-sectional view illustrating a portion of a dielectric tube in FIG. 1. FIG. 8 is a perspective view illustrating a power distributor in FIG. 1. FIG. 9 is a cross-sectional view taken along the line I-I' in FIG. 8. FIG. 10 is a cross-sectional view taken along the line II-II' in FIG. 8. FIG. 11 is a cross-sectional view taken along the line III-III' in FIG. 8.

Referring to FIGS. 1 to 11, a plasma processing apparatus 10 may include a chamber 20 defining a plasma processing space S between an upper wall 20a and a lower wall 20b, a substrate stage 26 supporting a substrate within the chamber 20, a baffle plate 90 disposed between the upper wall 20a of the chamber 20 and the substrate stage 26 and having a plurality of gas distribution holes 92, a gas supply configured to supply gas into the chamber 20 through at least one of a plurality of through holes 22a to 22f, and 24 formed in the upper wall 20a of the chamber 20, and a plasma generator 12 disposed on the upper wall 20a of the chamber 20 and configured to generate a first plasma in the chamber 20. The plasma processing apparatus 10 may further include a side coil 80 surrounding side walls 20c and 20d of the chamber 20, and a radio frequency (RF) power source 44 configured to generate a second plasma in the chamber 20 through the side coil 80.

In example embodiments, the plasma generator 12 may generate helicon-based inductively coupled plasma (first plasma) from the gas supplied into the chamber 20. The gas may be supplied by a gas supply. The plasma generator 12 may include a plurality of first dielectric tubes 100a to 100f, and a second dielectric tube 110 respectively disposed in the through holes 22a to 22f, and 24 formed in the upper wall 20a of the chamber 20, a plurality of upper magnets 200a to 200f provided on the upper wall 20a of the chamber 20 to be spaced apart from the first dielectric tubes 100a to 100f, a plurality of lower magnets 300a to 300f respectively provided between the first dielectric tubes 100a to 100f and the upper magnets 200a to 200f, a plurality of first antennas 30a to 30f respectively mounted on the first dielectric tubes 100a to 100f, a second antenna 32 mounted on the second dielectric tube 110, a first RF power source 40 configured to supply power to the first antennas 30a to 30f, and a second RF power source 42 configured to supply power to the second antenna 32.

In addition, the plasma processing apparatus 10 may include a pumping device 60 configured to exhaust residual gas remaining inside the chamber 20. The pumping device 60 may include an exhaust pipe 66 connected to an exhaust hole 64 formed in the lower wall 20b of the chamber 20.

In example embodiments, the plasma processing apparatus 10 may be an apparatus configured to deposit a target film on the substrate such as a semiconductor wafer disposed within the chamber 20 for plasma enhanced chemical vapor deposition (PECVD) process. The plasma processing apparatus 10 might not be necessarily limited to a deposition apparatus. For example, the plasma processing apparatus 10 may be used as an etching apparatus or a cleaning apparatus. The substrate may include a semiconductor substrate, a glass substrate, or the like.

The plasma processing apparatus 10 may be an inductively coupled plasma (ICP) processing apparatus using a plurality of antennas. For example, the plasma processing apparatus 10 may be a helicon-based ICP processing apparatus. However, the plasma generated by the plasma processing apparatus might not necessarily be limited to the inductively coupled plasma, and may include capacitively coupled plasma (CCP) or microwave type plasma.

The plasma processing apparatus 10 may use helicon plasma by using a permanent magnet having a high density while generating plasma at low pressure. The plasma processing apparatus 10 may generate high density plasma at low pressure to dissociate injected gas (e.g., $O_2$) to form an oxide film of a high level of purity. For example, the level of purity of the oxide film is affected by the injected gas, and accordingly, the plasma processing apparatus 10 may dissociate the injected gas as much as possible to improve the level of purity of the oxide film. The plasma processing apparatus 10 may have a wide pressure range. Within the wide pressure range, the plasma processing apparatus 10 can generate plasma at the low pressure to uniformly deposit the high purity oxide film, and then the plasma processing apparatus 10 may deposit the oxide film at high pressure to control characteristics of an oxide film shape.

The plasma enhanced chemical vapor deposition process may be a chemical process in which electromagnetic energy is applied to at least one precursor gas or precursor vapor to convert precursors into reactive plasma. The plasma enhanced chemical vapor deposition process may be used to deposit materials on semiconductor devices such as the semiconductor wafer W. For example, the plasma enhanced chemical vapor deposition process may deposit blanket dielectric films. The plasma may be generated at multiple locations. For example, the plasma may be generated in-situ inside the chamber 20. Alternatively, the plasma may be generated in a remote plasma generator installed to be spaced apart from the chamber 20.

In example embodiments, the chamber 20 may provide an enclosed space for performing a plasma deposition process on the wafer W. The chamber 20 may include multiple side walls, each of the multiple side walls made of a different material. For example, the chamber 20 may include a first side wall 20c made of a metal material and a second side wall 20d made of a non-metal material and continuously connected to the first side wall 20c.

The chamber 20 may include a plurality of the through holes 22a to 22f, 24 provided to penetrate through the upper wall 20a of the chamber 20. The first and second dielectric tubes 100a to 100f and 110 to be described later may be provided on a plurality of the through holes 22a to 22f, 24. The chamber 20 may be of multiple shapes. For example, the chamber 20 may be a cylindrical or rectangular vacuum chamber. The chamber 20 may include a metal such as aluminum or stainless steel. For example, chamber 20 may be a plasma processing chamber having tuning electrodes within the substrate stage 26 for enhanced processing rate and plasma profile uniformity.

The substrate stage 26 for supporting the substrate may be disposed inside the chamber 20. For example, the substrate stage 26 may serve as a susceptor for supporting the wafer W. The substrate stage 26 may include an electrostatic chuck for holding the wafer W by an electrostatic attraction force thereon. The electrostatic chuck may adsorb and hold the wafer W with an electrostatic force by a DC voltage supplied from a DC power source. The wafer W may be mounted on an upper surface of the electrostatic chuck, and a focus ring may be mounted around the wafer W.

The substrate stage 26 may further include a substrate electrode provided therein. The substrate electrode may be disposed under the wafer W. The substrate electrode may receive power from a fourth RF power source 48 through a fourth impedance matching network 49. For example, the fourth impedance matching network 49 may control plasma in the chamber 20 by varying an impedance of the substrate electrode. The substrate electrode may serve as the electrostatic chuck for maintaining the wafer W by the electrostatic attraction force.

In addition, the substrate electrode may have a circulation channel for cooling therein. Also, a cooling gas such as helium (He) gas may be supplied between the electrostatic chuck and the wafer W for precision of wafer temperature.

A gate for loading and unloading the wafer W may be installed in the side wall of the chamber 20. The wafer W may be loaded and unloaded onto the substrate stage through the gate.

The baffle plate 90 may be provided between the upper wall 20a of the chamber 20 and the substrate stage 26. The baffle plate 90 may include a plurality of the gas distribution holes 92 provided to penetrate therethrough in a thickness direction. The baffle plate 90 may control a flow of the gas to be injected from a gas distributor 70 to be described later. The baffle plate 90 may stably maintain pressure in the chamber 20 even when the pressure in the chamber 20 is rapidly changed according to an operation of the pumping device 60.

A value of a total area of the gas distribution holes 92 may be variably changed to control the flow of the gas. The area of the gas distribution holes 92 may be changed to actively correspond to the operation of the pumping device 60, as will be described later, such that the pressure inside the chamber 20 is optimally generated. The gas distribution holes 92 may create an environment such that the plasma is stably formed even under extremely low pressure conditions. For example, the gas distribution holes 92 may control a smooth flow of the gas and the uniformity of the gas in the chamber 20.

As illustrated in FIG. 3, a ratio A1/A3 of an area A1 of the substrate 28 provided on the substrate stage 26 and an area A3 of the gas distribution holes 92 may be within a range of about 1 to 5. The area A3 of the gas distribution hole 92 may be within a range of about 15,000 $mm^2$ to about 25,000 $mm^2$. A first distance D1 between the upper wall 20a of the chamber 20 and the baffle plate 90 may be within a range of about 15 mm to about 25 mm. A second distance D2 between the baffle plate 90 and the substrate stage 26 may be within a range of about 110 mm to about 130 mm.

The pumping device 60 may control the pressure inside the chamber 20. The pumping device 60 may exhaust the gas remaining inside the chamber 20 using the exhaust pipe 66 connected to the exhaust hole 64 formed in the lower wall 20b of the chamber 20. For example, the gas may include a precursor source, a reactive gas, a purging gas, and the like.

The exhaust pipe 66 of the pumping device 60 may include an inlet end portion 67 installed in the exhaust hole 64 through which the gas is introduced and an outlet end portion 68 from which the gas is evacuated. The outlet end portion 68 of the exhaust pipe 66 may have an area equal, a value of the area equal to a value of the total area of the gas distribution holes 92 of the baffle plate 90. The pumping device 60 may further include a drain pump 62 that drains sources used in the deposition process supplied from the gas distributor 70 to be described later.

For example, a ratio A1/A2 of the area A1 of the substrate 28 provided on the substrate stage 26 and an area A2 of the outlet end portion of the exhaust pipe 66 may be within a range of about 1 to 5. The area A2 of the outlet end portion of the exhaust pipe 66 may be within a range of about 15,000 mm$^2$ to about 25,000 mm$^2$.

The pumping device 60 may include a vacuum pump such as a turbo molecular pump to control the pressure of the processing space inside the chamber 20 to a desired degree of vacuum. Also, the pumping device 60 may discharge process by-products and residual process gases generated in the chamber 20 through an exhaust port. For example, the pumping device 60 may include a robust wide pumping device. The robust wide pumping device may have a pipe area within a range of about 50% to about 80% of an area of the chamber 20. Accordingly, the robust wide pumping device may selectively change the pressure inside the chamber 20 to the high pressure or the low pressure during a same process.

The side coil 80 may be provided to surround the second side wall 20d. The side coil 80 may generate the inductively coupled plasma inside the chamber. The side coil 80 may receive power from a third RF power source 44 through a third impedance matching network 46. The side coil 80 may generate the inductively coupled plasma in the chamber 20 with a range wider than that of the first and second antennas 30a to 30f and 32 to be described later.

The dielectric tubes may include a plurality of the first dielectric tubes 100a to 100f respectively provided on the through holes 22a to 22f. The plurality of the first dielectric tubes 100a to 100f may be symmetrically disposed along a circumferential direction with respect to a center of the chamber 20. The second dielectric tube 110 provided on the through hole 24 may be disposed in the center of the chamber 20.

The first and second dielectric tubes 100a to 100f and 110 may be respectively disposed on the through holes 22a to 22f, and 24. Spaces inside the first and second dielectric tubes 100a to 100f and 110 may be maintained in a vacuum state. The vacuum state of the first and second dielectric tubes 100a to 100f and 110 may be maintained by O-rings provided on upper portions of the through holes. The first and second dielectric tubes 100a to 100f and 110 may have a bell-jar shape without a lid. The first and second dielectric tubes 100a to 100f and 110 may include a washer-shaped support portion and a cylindrical portion.

The first and second dielectric tubes 100a to 100f and 110 may include glass, quartz, alumina, sapphire, or ceramic. First end portions of the first and second dielectric tubes 100a to 100f and 110 may be respectively connected to the through holes 22a to 22f, and 24 of the chamber 20, and second end portions of the first and second dielectric tubes 100a to 100f and 110 may be respectively connected to metal covers 102a to 102f and 104. The metal covers 102a to 102f and 104 may include a gas inlet 72 for introducing the gas. The metal covers 102a to 102f and 104 may reflect a helicon wave to cause constructive interference. Each of the first and second dielectric tubes 100a to 100f, and 110 may have a length of about several centimeters to about several tens of centimeters. The length of each of the first and second dielectric tubes 100a to 100f, and 110 may be determined by a radius R of the dielectric tube, a magnetic flux density $B_0$ in the dielectric tube, a plasma density $\eta_0$, and a frequency f of the antenna.

When the radius is R, and assuming that the plasma in the first and second dielectric tubes is uniform, the radial current density may be zero at side walls of the first and second dielectric tubes 100, 110 for a helicon mode with m=0. The length ($L/2=\pi/k_z$) of each of the first and second dielectric tubes 100a to 100f and 110 may correspond to a half-wavelength of the helicon wave and may be expressed as following Equation (1).

$$k_z^4 + \left(\frac{3.83}{R}\right)^2 k_z^2 - \left(\frac{e\mu_0 n_0 w}{B_0}\right)^2 = 0. \quad \text{Equation (1)}$$

Here, e is a charge amount of electron, $B_0$ is a strength of the magnetic flux density, $\mu_0$ is a permeability, $\omega$ is an angular frequency, $\eta_0$ is a density of plasma, and $k_z$ is a wave number of the helicon wave. For example, when the frequency f is 13.56 MHz, $B_0$ is 90 Gauss and $\eta_0$ is $4 \times 10^{12}$ cm$^{-3}$, L may be 11.3 cm.

The antennas may include a plurality of the first antennas 30a to 30f and the second antenna 32 that are classified based on geometric symmetry. The first antennas 30a to 30f may be respectively mounted on the sidewalls of the first dielectric tubes 100a to 100f. The second antenna 32 may be mounted on the sidewall of the second dielectric tube 110. The first and second antennas 30a to 30f, and 32 may have the same structure. For example, the first and second antennas 30a to 30f and 32 may be conductive pipes having a cylindrical shape or a rectangular cylindrical shape. For example, a refrigerant may flow through the first and second antennas 30a to 30f and 32.

The first antennas 30a to 30f may be symmetrically disposed respect to a center. For example, the first antennas 30a to 30f may be symmetrically disposed around a circumference of a constant radius with respect to the center of the upper wall 20a of the chamber 20. The second antenna 32 may be disposed at the center of the upper wall 20a. For example, the number of the first antennas 30a to 30f may be within a range of about 4 to about 8. The number of the second antenna 32 may be one. The first and second antennas 30a to 30f and 32 may be three-turn antennas. The first and second antennas 30a to 30f and 32 may be combined with the upper magnets 200a to 200f and the lower magnets 300a to 300f to generate the helicon plasma at the low pressure of several mTorr. When the pressure in the chamber 20 is tens of mTorr or more, the inductively coupled plasma may be generated regardless of the upper and lower magnets 200a to 200f and 300a to 300f.

The first RF power source 40 may output wave of a first driving frequency, for example, a sine wave. The power of the first RF power source 40 may be applied to a first power distributor 50 through a first impedance matching network 41. For example, the frequency of the first RF power source 40 may be within a range of several hundred kHz to several hundred MHz.

The second RF power source 42 may supply the power to the second antenna 32. In order to minimize interference between the first RF power source 40 and the second RF power source 42, the first RF power source 40 may have the first driving frequency, and the second RF power source 42 may have a second driving frequency different from the first driving frequency. For example, the first driving frequency may be 13.56 MHz, and the second driving frequency may be 12 MHz. The second RF power source 42 may be directly connected to the second antenna 32 through a second impedance matching network 43.

The first power distributor 50 may distribute the power supplied through the first impedance matching network 41 to the first antennas 30a to 30f connected in parallel. The first power distributor 50 may include a first power distribution line 50a and a first conductive shell 50b surrounding the first power distribution line 50a and grounded. Distances between an input terminal N1 of the first power distributor 50 and between the first antennas 30a to 30f may be the same. A first insulating portion may be provided between the first power distribution line 50a and the first conductive shell 50b.

The first power distributor 50 may include an input branch 52 having a coaxial cable type and receiving the power from the first RF power source 40, a 3-way branch having the coaxial cable type connected to the input branch 52 and split into three split branches, and T-branches 56 having the coaxial cable type connected to the 3-way branch 54 and divided into three divided branches.

The input branch 52 may have the cylindrical shape. The input branch 52 may have a coaxial cable structure. In one example, the input branch 52 may include a cylindrical inner conductor 52c, a cylindrical insulator 52b surrounding the cylindrical inner conductor, and a cylindrical outer conductor 52a surrounding the cylindrical insulator. The refrigerant may flow through the inner conductor 52c.

One end of the input branch 52 may be connected to the first impedance matching network 41, and the other end of the input branch 52 may be connected to the 3-way branch 54 divided at intervals of 120 degrees. The 3-way branch 54 may have a rectangular cylindrical shape. The 3-way branch 54 may be disposed to be spaced apart from the upper wall 20a in a vertical direction (Z direction). The 3-way branch 54 may have the coaxial cable structure. The 3-way branch 54 may include a cylindrical inner conductor 54c, a rectangular cylindrical shape insulator 54b surrounding the cylindrical inner conductor and an outer conductor 54a with the rectangular cylindrical shape surrounding the rectangular cylindrical shape insulator. The refrigerant supplied through the inner conductor 52c of the input branch 52 may flow into the cylindrical inner conductor 54c of the 3-way branch 54.

The T-branches 56 may be connected to the 3-way branch 54 to distribute the power into the two divided branches. The T-branches 56 may have the rectangular cylindrical shape. The T-branches 56 may have the coaxial cable structure. The T-branches 56 may include an inner conductor 56c having the cylindrical shape, an insulator 56b surrounding the inner conductor and an outer conductor 56a surrounding the insulator. The refrigerant may flow into the inner conductor 56c. The T-branches 56 may have arms of a same length.

The T-branches 56 may respectively supply the power to a pair of antennas 30a and 30b. Each of the split branches of the T-branch 56 may have a same shape as each other. The inner conductor 56c may be continuously connected to the pair of antennas 30a and 30b to simultaneously supply the power and the refrigerant. The refrigerant supplied through the inner conductor 54c of the 3-way branch 54 may flow into the inner conductor 56c of the T-branch 56.

The first and second antennas 30a to 30f and 32 are supported by fixing plates 58 that are fixed to the upper wall 20a of the chamber 20. One end of each of the fixing plates 58 may be connected to one end of each of the first and second antennas 30a to 30f, 32 to be grounded. The other end of each of the fixing plates 58 may be connected to one end of a ground line 59 to be grounded.

The ground line 59 may be connected to the fixing plate 58 and the outer conductor 56a of the T-branch 56. One end of the ground line 59 may be connected to the other end of the fixing plate 58, and the other end of the ground line 59 may be connected to the outer conductor 56a of the T-branch 56. Lengths of the ground lines 59 for the first antennas 30a to 30f may be the same. Accordingly, all of the first antennas 30a to 30f may have same impedance.

The gas distributor 70 may supply the gas to the dielectric tubes. The gas distributor 70 may have a structure similar to the single first power distributor 50 and may distribute the gas to the dielectric tubes. In some examples, the gas distributor 70 may evenly and uniformly distribute the gas to the dielectric tubes. The gas distributor 70 may be provided on the metal covers 102a to 102f and 104, respectively. The gas distributor 70 may be provided to have a same length as the metal covers 102a to 102f, 104. For example, the gas distributor 70 may be branched into three branches from the second metal cover 104 of the second dielectric tube 110, and may be again branched into a T-shape to be respectively connected to the first metal covers 102a to 102f of the first dielectric tubes 100a to 100f.

A plurality of the upper magnets 200a to 200f may be provided on the first dielectric tubes 100a to 100f to be spaced apart from the first dielectric tubes 100a to 100f in the vertical direction (Z direction). The upper magnets 200a to 200f may be provided on a same first plane P1.

The upper magnets 200a to 200f may have, for example, a donut shape or a toroidal shape. Cross-sections of the upper magnets 200a to 200f may be, for example, square or circular. A magnetization direction of the upper magnets 200a to 200f may be the vertical direction (Z direction) perpendicular to the first plane P1 in which the upper magnets 200a to 200f are disposed.

The upper magnets 200a to 200f may be inserted into an upper magnet fixing plate 212. The upper magnets 200a to 200f may be provided to be spaced apart from a center of the first antennas 30a to 30f in the vertical direction (Z direction).

A first moving portion 210 may be fixedly coupled to the upper wall 20a of the chamber 20. The first moving portion 210 may include at least one first support 216 extending perpendicular to a plane on which the first and second dielectric tubes 100a to 100f and 110 are disposed. The upper magnet fixing plate 212 may move along the first support 216 that is inserted into an insertion hole of the upper magnet fixing plate 212. An upper through hole 214 may be formed at a center of the upper magnet fixing plate 212. The input branch 52 may be connected to the first impedance matching network 41 through the upper through hole 214.

The upper magnet fixing plate 212 may fix the upper magnets 200a to 200f on the first plane P1. The upper magnets 200a to 200f may be arranged in the vertical direction (Z direction) to the first antennas 30a to 30f. The upper magnets 200a to 200f may be inserted into and fixed to the upper magnet fixing plate 212. The first moving portion 210 may generate the helicon mode by controlling the intensity of the magnetic flux density $B_0$ in the first and second dielectric tubes 100a to 110f.

A plurality of the lower magnets 300a to 300f may be provided on the first dielectric tubes 100a to 100f to be spaced apart from the first dielectric tubes 100a to 100f in the vertical direction (Z direction). The lower magnets 300a to 300f may be respectively provided between the first dielectric tubes 100a to 100f and the upper magnets 200a to 200f. The lower magnets 300a to 300f may be provided on a same second plane P2. Each of the central axes of the upper magnets 200a to 200f and each of the central axes of the lower magnets 300a to 300f may coincide with each other, respectively. Plasma may be formed in the first and second dielectric tubes 100a to 100f and 110. The RF power source of the first and second RF power sources 40 and 42 may operate within a range of about several MHz to about several tens of MHz, and a magnetic field of the upper and lower magnets 200 and 300 may apply, for example, hundreds to thousands of Gauss G to generate the plasma in which a Whistler phenomenon rotating in the magnetic field is generated.

The lower magnets 300 may be respectively provided under the upper magnets 200 to form the uniform plasma.

The lower magnets 300 may have, for example, the donut shape or the toroidal shape. Cross-section of the lower magnet 300 may be a rectangular shape or a circular shape. The magnetization direction of the lower magnet 300 may be the vertical direction (Z direction) perpendicular to the second plane P2 on which the lower magnet 300 is disposed.

The lower magnets 300 may be inserted into a lower magnet fixing plate 312. The lower magnets 300 may be provided to be spaced apart from the center of the first antennas 30 in the vertical direction (Z direction).

A second moving portion 310 may be fixed and coupled to the upper wall 20a of the chamber 20. The second moving portion 310 may include at least one second support 316 extending perpendicular to the plane on which the first and second dielectric tubes 100 and 110 are disposed. The lower magnet fixing plate 312 may move along the second support 316 that is inserted into an insertion hole of the lower magnet fixing plate 312.

The lower magnet fixing plate 312 may fix the lower magnets 300 on the second plane P2. The lower magnets 300 may be arranged in the vertical direction (Z direction) to be aligned with the first antennas 30. The lower magnets 300 may be inserted into and fixed to the lower magnet fixing plate 312. The second moving portion 310 may generate the helicon mode by controlling the intensity of the magnetic flux density $B_0$ in the first and second dielectric tubes 100 and 110.

The first and second moving portions 210 and 310 may move such that the ratio $B_0/\eta_0$ of the plasma density $\eta_0$ to the magnetic flux density $B_0$ is constant for a given condition L, $\omega$, R. $B_0$ may represent the intensity of magnetic flux density at the center of the first and second dielectric tubes, R may represent the radius of each of the first and second dielectric tubes, the length of each of the first and second dielectric tubes may be L/2, the $\omega$ may represent the angular frequency of the first RF power source, and the $\eta_0$ may represent the density of the plasma.

According to some example embodiments, the pumping device 60 and the baffle plate 90 provided in the chamber 20 may control the pressure inside the chamber 20 within a wide range during the process, the high density and high ionized helicon plasma may be generated even at low pressure to form a high-quality deposition layer. In addition, since the first and second antennas 30 and 32 allow the plasma to be uniformly spread, the plasma with uniform density and energy may be delivered to a surface of the semiconductor wafer provided on the substrate stage 26 in the chamber 20.

Hereinafter, a method of manufacturing a semiconductor device using the plasma processing apparatus in FIG. 1 will be explained.

Figure 12:
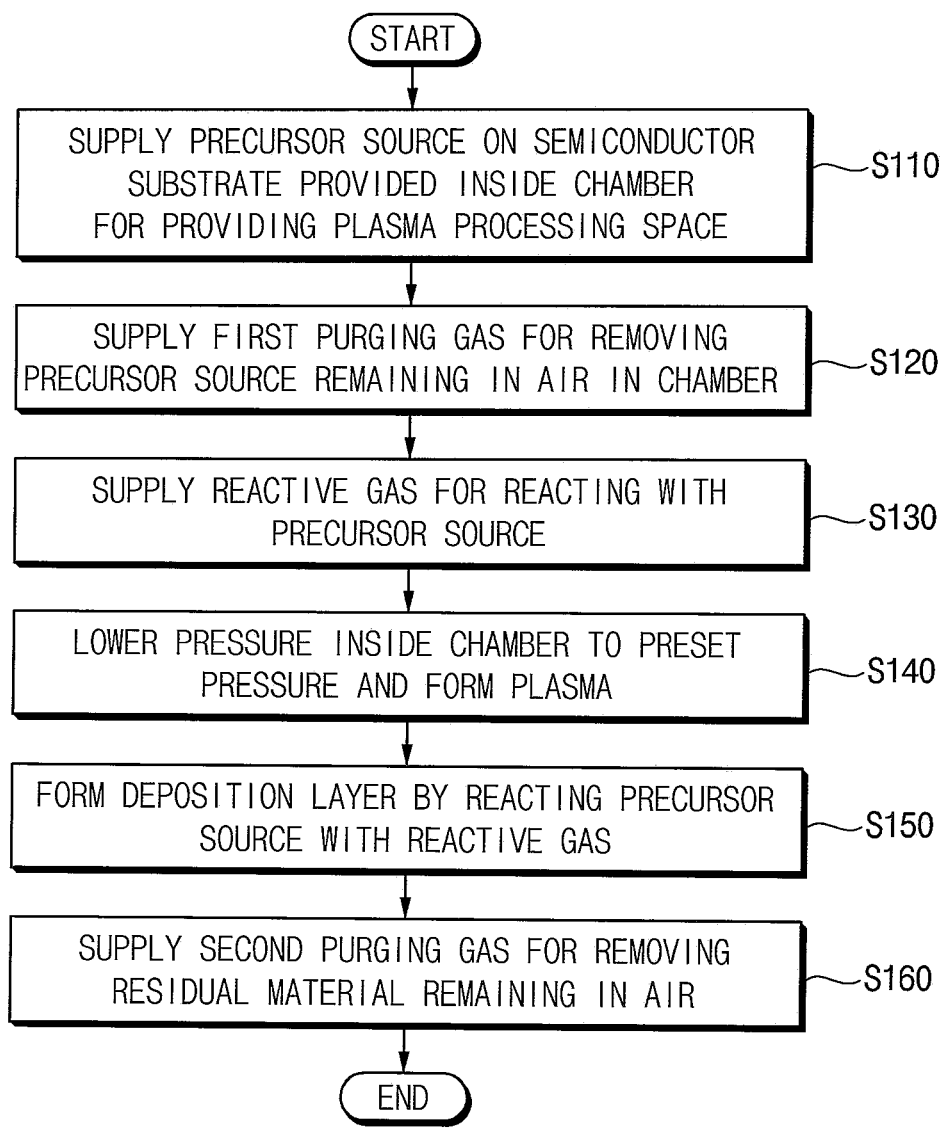
FIG. 12 is a flow chart illustrating a semiconductor device manufacturing method in accordance with example embodiments.

FIG. 12 is a flow chart illustrating a method of manufacturing a semiconductor device in accordance with example embodiments. FIGS. 13 to 18 are views illustrating the method of manufacturing a semiconductor device.

Referring to FIGS. 1 to 18, first, a precursor source may be supplied on a semiconductor substrate 28 within a chamber 20 for providing a plasma processing space (S110).

In example embodiments, a plasma processing apparatus 10 may be an apparatus for depositing a target film on the substrate 28 such as a semiconductor wafer disposed in the chamber 20 for plasma enhanced chemical vapor deposition (PECVD) process.

Figure 13:
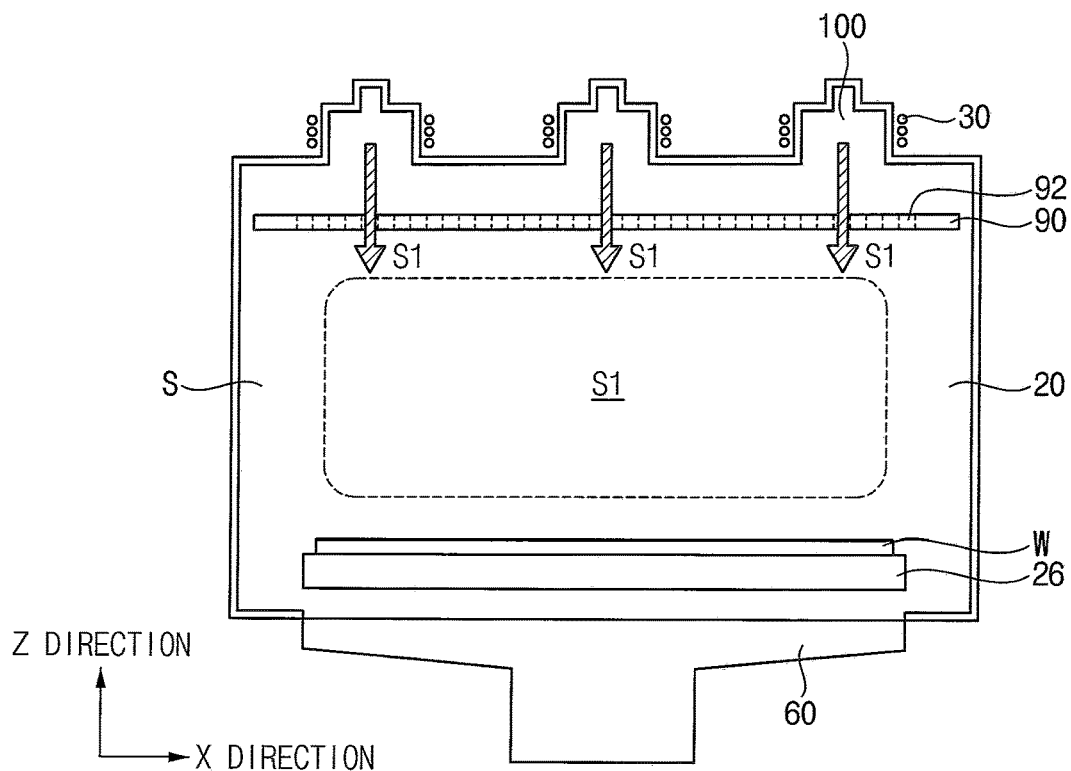
FIGS. 13 to 18 are views illustrating a semiconductor device manufacturing method.

As illustrated in FIG. 13, the precursor source S1 may include a reactive material for forming a deposition layer on the substrate. The precursor source supplied into the chamber 20 may fill the space of the chamber 20 and may contact a surface of the semiconductor wafer. For example, the precursor source may include a silicon-based source. The silicon-based source may include a silicon chlorine compound ($Si_2Cl_6$). When the precursor source is supplied, pressure inside the chamber 20 may be within a range of about 500 mTorr to about 700 mTorr.

Then, a first purging gas may be supplied to remove the precursor source remaining in air in the chamber 20 (S120).

Figure 14:
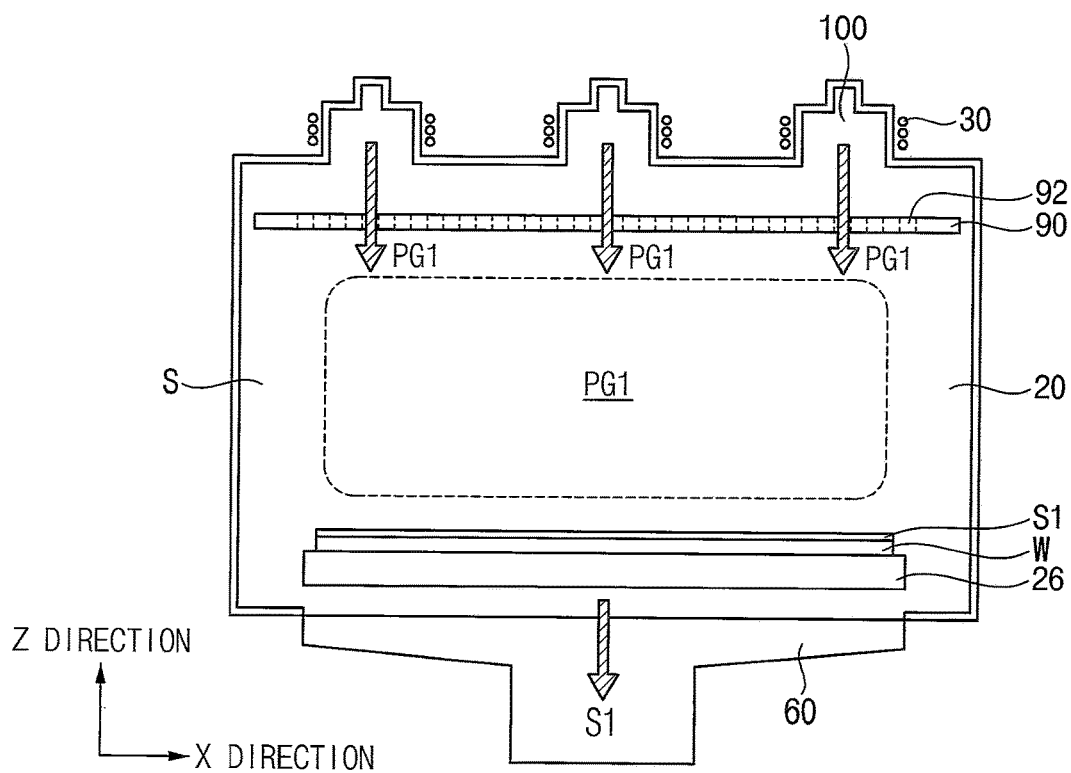

In example embodiments, as illustrated in FIG. 14, the precursor source remaining in the air inside the chamber 20 may be discharged to an outside by the first purging gas PG1. The precursor source may be discharged to the outside of the chamber 20 by a pumping device 60. The first purging gas may increase the pressure of the chamber 20 such that the precursor source existing inside the chamber 20 is discharged to the outside. The first purging gas may include a material having low reactivity, such that the pressure of the chamber 20 is increased without affecting the semiconductor substrate.

For example, the first purging gas may include a material having ionization energy E of 15 eV or more. The first purging gas may include, for example, helium (He), neon (Ne), nitrogen ($N_2$), fluorine ($F_2$), hydrogen ($H_2$), etc. When the first purging gas is supplied, the pressure inside the chamber 20 may be within a range of about 700 mTorr to about 1 Torr.

Then, a reactive gas may be supplied to react with the precursor source (S130).

Figure 15:
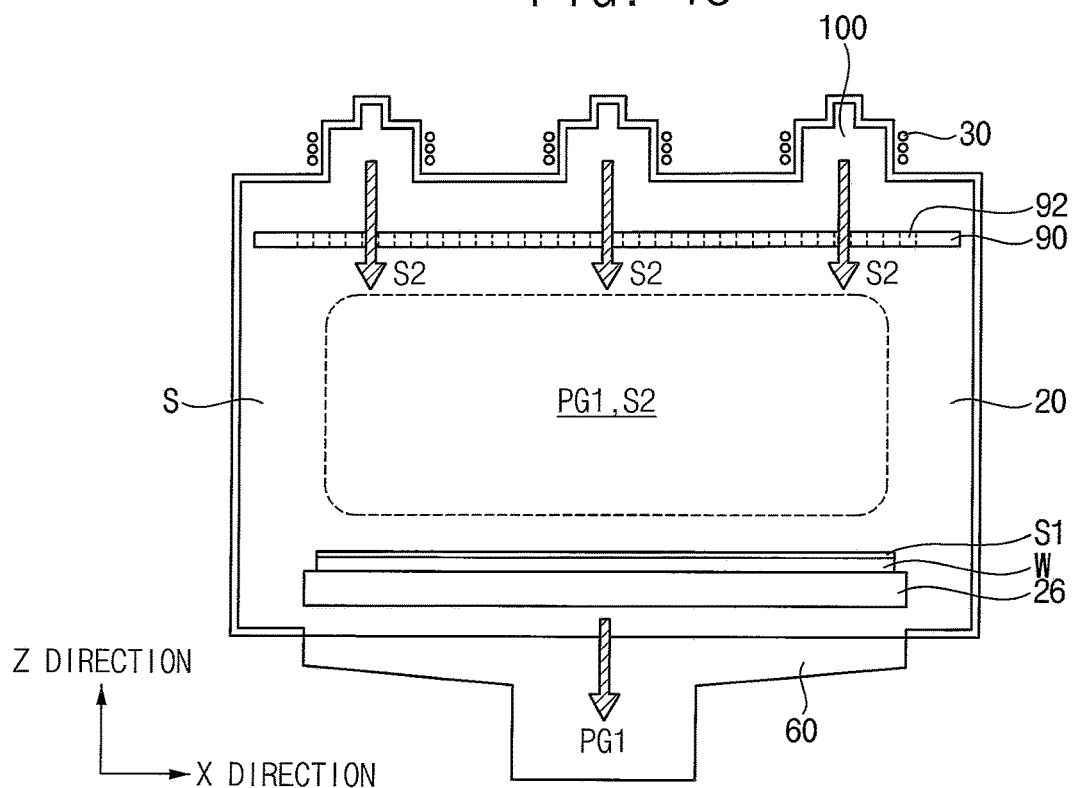

In example embodiments, as illustrated in FIG. 15, the reactive gas S2 may include the same material as the first purging gas PG1. When the reactive gas is required to include the same material as the first purging gas, the first purging gas may be used as the reactive gas without supplying an additional reactive gas supplied into the chamber 20. Alternatively, when the first purging gas and the reactive gas are required to include different materials, the first purging gas may be discharged to the outside of the chamber 20 by the pumping device 60.

For example, the reactive gas may include a material having ionization energy E of, for example, 15 eV or more. The reactive gas may include a mixture of nitrogen ($N_2$) and ammonia ($NH_3$). The reactive gas may include helium (He), neon (Ne), nitrogen ($N_2$), fluorine ($F_2$), and hydrogen ($H_2$).

When the reactive gas is supplied, a precursor material may be supplied into the chamber 20. The precursor material may serve as a catalyst such that the precursor source and the reactive gas actively react. For example, the precursor material may include ammonia ($NH_3$), methane ($CH_4$), and ethane ($C_2H_6$).

Then, the pressure inside the chamber may be lowered to a predetermined pressure, and plasma may be generated (S140).

Figure 16:
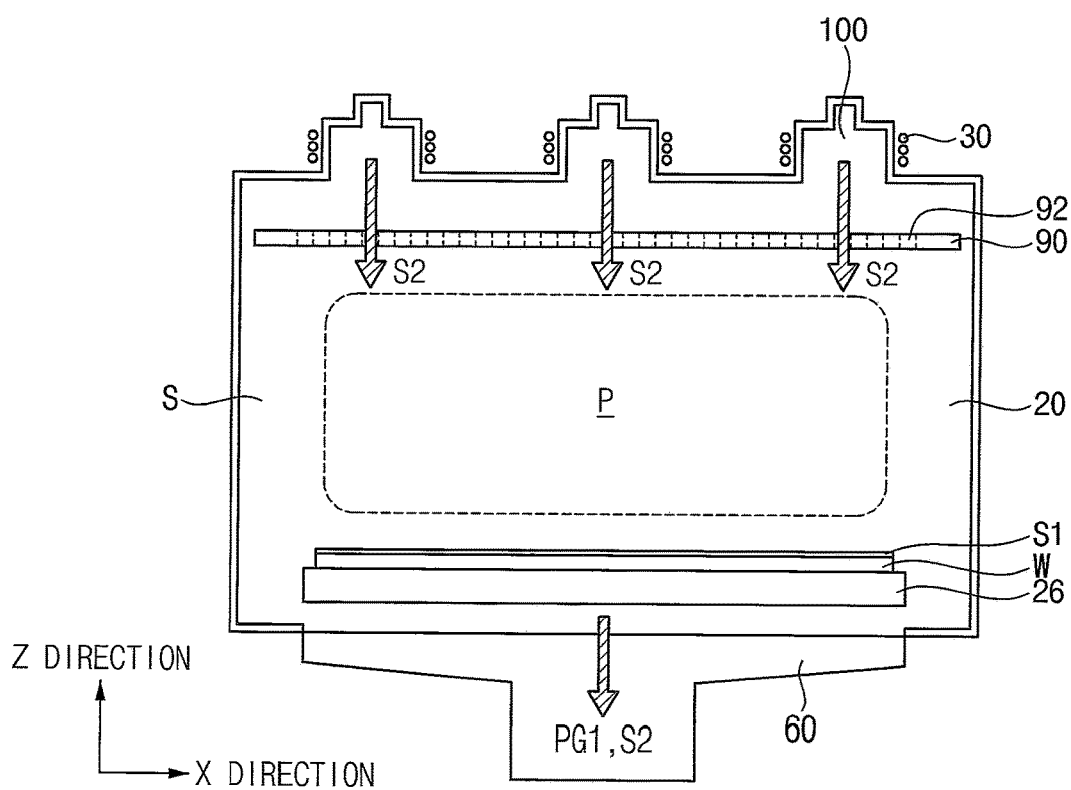

In example embodiments, as illustrated in FIG. 16, helicon-based inductively coupled plasma (ICP) may be generated in the chamber 20 by applying power from RF power source to a plurality of antennas 30 provided on an upper portion of the chamber 20. For example, helicon plasma may be generated at low pressure and may have high density. The helicon plasma may be generated using a high power of 10 kW or more.

The reactive gas S2 may supplied through a plurality of gas distribution holes 92 provided in a baffle plate 90 to generate the plasma P having uniform density and energy, and may be transferred to the surface of the semiconductor wafer W.

The pumping device 60 provided in a lower portion of the chamber 20 may be used to lower the pressure inside the chamber 20 to a predetermined pressure. The pumping device 60 may include a robust wide pumping device. The robust wide pumping device may have a pipe area within a range of about 50% to about 80% of an area of the chamber 20. Accordingly, the robust wide pumping device may selectively change the pressure inside the chamber 20 to high pressure or low pressure during a same process.

The predetermined pressure may be within a range of about 0.1 mTorr to about 10 mTorr. The plasma processing apparatus 10 may provide low pressure environment using the robust wide pumping device.

The plasma may be generated by using a Whistler phenomenon for densifying and ionizing the plasma. Accordingly, highly ionized plasma having the high density may be generated at the preset pressure. The plasma may include the helicon plasma that is generated using the high power of 10 kW or more.

Then, the precursor source may be reacted with the reactive gas to form a deposition layer (S150).

Figure 17:
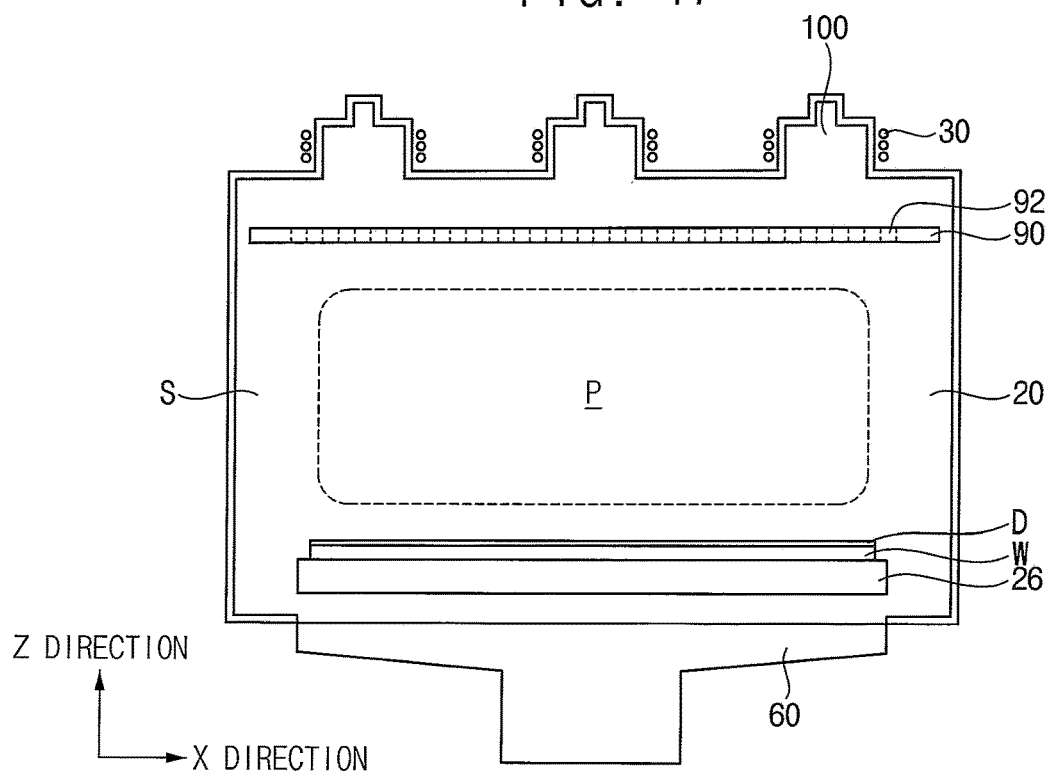

In example embodiments, as illustrated in FIG. 17, the reactive gas S2 and the precursor source S1 may react with each other at the predetermined pressure to form the deposition layer D.

When the reactive gas and the first purging gas are required to include the same material, the first purging gas PG1 and the precursor source S1 may react with each other to form the deposition layer D. The reactive gas may include the same material as the first purging gas. The first purging gas may be densified and highly ionized using the Whistler phenomenon and may react with the precursor source. Accordingly, the deposition layer may be formed using the first purging gas without supplying an additional reactive gas. When the deposition layer is formed, the pressure inside the chamber 20 may be within a range of about 0.1 mTorr to about 10 mTorr.

For example, the deposition layer formed on the semiconductor substrate may include a silicon nitrogen compound (SiN), a silicon carbon nitrogen compound (SiCN), a silicon oxygen carbon nitrogen compound (SiOCN), etc.

Then, a second purging gas may be supplied to remove a residual material remaining in the air (S160).

Figure 18:
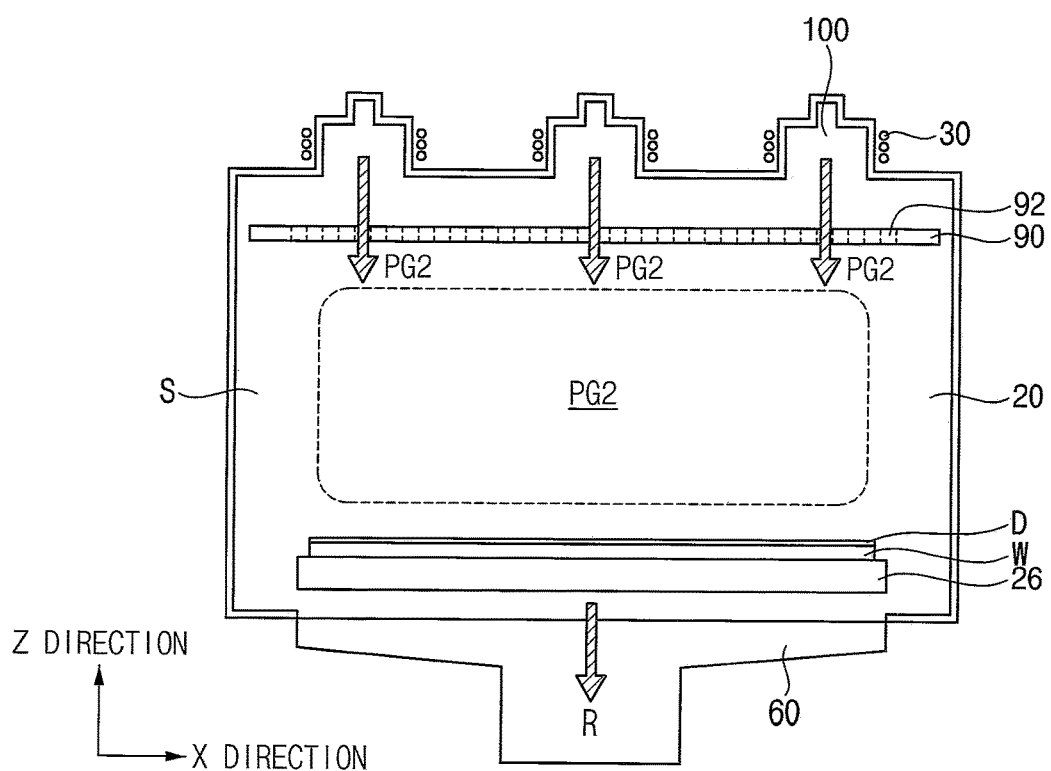

In example embodiments, as illustrated in FIG. 18, the second purging gas PG2 may discharge the residual material R remaining in the air inside the chamber 20 to the outside. The residual material may be discharged to the outside of the chamber 20 by the pumping device 60. The second purging gas may increase the pressure of the chamber 20 such that the residual material existing inside the chamber 20 is discharged to the outside. The second purging gas may include the material having the low reactivity, such that the pressure of the chamber 20 is increased without affecting the semiconductor substrate.

For example, the second purging gas may include the same material as the first purging gas. The second purging gas may include a material having ionization energy E of 15 eV or more. The second purging gas may include helium (He), neon (Ne), nitrogen ($N_2$), fluorine ($F_2$), and hydrogen ($H_2$). When the second purging gas is supplied, the pressure inside the chamber 20 may be within a range of 700 mTorr to 1 Torr.

For example, the pumping device 60 and the baffle plate 90 provided in the chamber 20 control the pressure inside the chamber 20 within a wide range during the process, even at low pressure, a high-quality deposition layer may be formed by generating the high density and high ionized helicon plasma. In addition, since the first and second antennas 30 and 32 allow the plasma to be uniformly spread, the plasma may be delivered to a surface of the semiconductor wafer provided on the substrate stage 26 in the chamber 20 with uniform density and energy.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims.

What is claimed is:

1. A plasma processing apparatus, comprising:
    a chamber having an upper wall and a lower wall, the upper wall having a plurality of through holes formed therein and the lower wall having an exhaust hole formed therein, wherein the chamber defines a plasma processing space between the upper wall and the lower wall;
    a substrate stage disposed within the chamber, the substrate stage having a seating surface, wherein a substrate is seated on the seating surface;
    a baffle plate disposed between the upper wall and the substrate stage, the baffle plate having a plurality of gas distribution holes formed therein;
    a gas supply configured to supply gas into the chamber through at least one of the through holes formed in the upper wall;
    a pumping device including an exhaust pipe, the exhaust pipe connected to the exhaust hole to control pressure inside the chamber; and
    a plasma generator configured to generate a first plasma using the gas supplied into the chamber through at least one of the through holes formed in the upper wall, wherein a value of an area of an outlet end portion of the exhaust pipe is the same as a value of a total area of the gas distribution holes of the baffle plate.

2. The plasma processing apparatus of claim 1, further comprising:
a plurality of first dielectric tubes respectively provided on a plurality of first through holes, wherein the first through holes are arranged within a first plane and are symmetrically disposed in a circumferential direction with respect to a center of the chamber;
a second dielectric tube disposed on a second through hole, wherein the second through hole is disposed at the center of the chamber;
a plurality of upper magnets vertically spaced apart from the first dielectric tubes, the plurality of upper magnets disposed on the first plane;
a plurality of first antennas respectively mounted on first sidewalls of the first dielectric tubes;
a second antenna mounted on a second sidewall of the second dielectric tube;
a first radio frequency (RF) power source configured to supply first power to the first antennas;
a second RF power source configured to supply second power to the second antenna; and
a first power distributor disposed between the first antennas and the first RF power source to distribute to the first antennas the first power supplied by the first RF power source.

3. The plasma processing apparatus of claim 1, wherein a ratio A1/A3 of an area A1 of the substrate and an area A3 of the gas distribution holes is within a range of about 1 to 5.

4. The plasma processing apparatus of claim 1, wherein a first distance between the upper wall and the baffle plate is within a range of about 15 mm to about 25 mm, and
a second distance between the baffle plate and the substrate stage is within a range of about 110 mm to about 130 mm.

5. The plasma processing apparatus of claim 1, wherein the pumping device includes a robust wide pumping device configured to control the pressure inside the chamber to be within a range of about 0.1 mTorr to about 1 Torr.

6. The plasma processing apparatus of claim 1, further comprising:
a side coil surrounding a side wall of the chamber to generate an inductively coupled plasma inside the chamber; and
a third RF power source configured to supply third power to the side coil.

7. The plasma processing apparatus of claim 2, further comprising:
a plurality of lower magnets disposed on a second plane, the second plane disposed between the plurality of first dielectric tubes and the plurality of upper magnets, each of the plurality of lower magnets and each of the plurality of upper magnets have a same central axis.

8. The plasma processing apparatus of claim 7, further comprising:
a first moving portion configured to move the upper magnets provided on the first plane, at least one of the upper magnets being fixed in the first moving portion; and
a second moving portion configured to move the lower magnets provided on the second plane, at least one of the lower magnets being fixed in the second moving portion,
wherein during a moving of the first moving portion and the second moving portion, a ratio ($B_0/n_0$) of a plasma density ($n_0$) to a magnetic flux density ($B_0$) is constant for a given condition (L, $\omega$, R), wherein $B_0$ includes the magnetic flux density at a center of the first and second dielectric tubes, R includes a radius of the first and second dielectric tubes, a length of the first and second dielectric tubes is L/2, $\omega$ includes an angular frequency of the first RF power source, and $n_0$ includes the density of the plasma.

9. The plasma processing apparatus of claim 2, wherein the first power distributor includes:
an input branch having a coaxial cable type and configured to receive the first power supplied by the first RF power source;
a 3-way branch having the coaxial cable type and connected to the input branch and split into three split branches;
T-branches having the coaxial cable type and connected to the 3-way branch and divided into two divided branches;
fixing plates fixed to the upper wall of the chamber, the first antennas being fixed in the fixing plates respectively; and
a ground line configured to connect each of the fixing plates and an outer conductor of each of the T-branches,
wherein a first end of each of the fixing plates is connected to an inner conductor of each of the T-branches through each of the first antennas and a second end of each of the fixing plates is connected to the ground line, and
a length of the ground line is same for all antennas.

10. A plasma processing apparatus, comprising:
a chamber having an upper wall and a lower wall, the upper wall having a plurality of through holes formed therein and the lower wall having an exhaust hole formed therein, wherein the chamber defines a plasma processing space between the upper wall and the lower wall;
a substrate stage provided within the chamber, the substrate stage having a seating surface for supporting a substrate;
a baffle plate disposed between the upper wall and the substrate stage, the baffle plate having a plurality of gas distribution holes formed therein;
a gas supply configured to supply gas into the chamber through at least one of the through holes formed in the upper wall;
a pumping device having an exhaust pipe, the exhaust pipe connected to the exhaust hole to control pressure inside the chamber;
a plurality of first dielectric tubes respectively provided on a plurality of first through holes, wherein the first through holes are symmetrically disposed on a first plane in a circumferential direction with respect to a center of the chamber;
a second dielectric tube provided on a second through hole, wherein the second through hole is disposed at the center of the chamber;
a plurality of upper magnets vertically spaced apart from the first dielectric tubes, the plurality of upper magnets provided on the first plane;
a plurality of lower magnets provided to respectively correspond to a plurality of the upper magnets on a second plane between the plurality of first dielectric tubes and the plurality of upper magnets on the upper wall;
a plurality of first antennas respectively mounted on the plurality of first dielectric tubes;

a second antenna mounted on the second dielectric tube; and a power supply configured to supply first power to the first antennas and second power to second antennas, wherein a value of an area of an outlet end portion of the exhaust pipe is equal to a value of a total area of the gas distribution holes of the baffle plate.

11. The plasma processing apparatus of claim 10, wherein a ratio A1/A3 of an area A1 of the substrate and an area A3 of the gas distribution holes is within a range of about 1 to about 5.

12. The plasma processing apparatus of claim 10, wherein a first distance between the upper wall and the baffle plate is within a range of about 15 mm to about 25 mm, and a second distance between the baffle plate and the substrate stage is within a range of about 110 mm to about 130 mm.

13. The plasma processing apparatus of claim 10, wherein the pumping device includes a robust wide pumping device configured to control the pressure inside the chamber to be within a range of about 0.1 mTorr to 1 Torr.

14. The plasma processing apparatus of claim 10, further comprising:

a side coil surrounding a side wall of the chamber to generate an inductively coupled plasma inside the chamber; and a third radio frequency (RF) power source configured to supply third power to the side coil.

15. The plasma processing apparatus of claim 10, further comprising:

a first moving portion configured to move the upper magnets provide on the first plane, at least one of the upper magnets being fixed in the first moving portion; and a second moving portion configured to move the lower magnets provided on the second plane, at least one of the lower magnets being fixed in the second moving portion, wherein during a move of the first moving portion and the second moving portion, a ratio ($B_0/n_0$) of a plasma density ($n_0$) to a magnetic flux density ($B_0$) is constant for given conditions (L, ω, R), wherein $B_0$ is the magnetic flux density at a center of the first and second dielectric tubes, R is a radius of the first and second dielectric tubes, a length of the first and second dielectric tubes is L/2, ω is an angular frequency of the first RF power source supplying power to the first antennas, and $n_0$ is the density of the plasma.

16. The plasma processing apparatus of claim 10, wherein the power supply includes:

a first RF power source configured to supply the first power to the first antennas;

a second RF power source configured to supply the second power to the second antenna; and a first power distributor disposed between the first antennas and the first RF power source to distribute to the first antennas the first power of the first RF power source.

17. The plasma processing apparatus of claim 16, wherein the first power distributor includes:

an input branch having a coaxial cable type and configured to receive the first power supplied by the first RF power source;

a 3-way branch having the coaxial cable type and connected to the input branch and split into three split branches; and T-branches having the coaxial cable type and connected to the 3-way branch and divided into two divided branches.

18. The plasma processing apparatus of claim 17, wherein the first power distributor further includes, fixing plates fixed to the upper wall, the first antennas being fixed in the fixing plate; and a ground line configured to connect each of the fixing plates and an outer conductor of each of the T-branches, wherein a first end of each of the fixing plates is connected to an inner conductor of each of the T-branches through each of the first antennas and the second end of each of the fixing plates is connected to the ground line, and a length of the ground line is same for all antennas.

19. A plasma processing apparatus, comprising:

a chamber having an upper wall and a lower wall, the upper wall having a plurality of through holes formed therein and the lower wall having an exhaust hole formed therein, wherein the chamber defines a plasma processing space between the upper wall and the lower wall;

a substrate stage disposed within the chamber, the substrate stage having a seating surface for supporting a substrate;

a baffle plate disposed between the upper wall and the substrate stage, the baffle plate having a plurality of gas distribution holes formed therein;

a gas supply configured to supply gas into the chamber through at least one of the through holes formed in the upper wall;

a pumping device having an exhaust pipe, the exhaust pipe connected to the exhaust hole to control pressure inside the chamber;

a plurality of first dielectric tubes respectively disposed on a plurality of first through holes, wherein the first through holes are on a first plane and are symmetrically disposed in a circumferential direction with respect to a center of the chamber;

a second dielectric tube disposed on a second through hole, wherein the second through hole is disposed at the center of the chamber;

a plurality of upper magnets vertically spaced apart from the first dielectric tubes, the plurality of upper magnets disposed on the first plane;

a plurality of lower magnets disposed on a second plane between the plurality of first dielectric tubes and the plurality upper magnets on the upper wall;

a plurality of first antennas respectively mounted on the plurality of first dielectric tubes;

a second antenna mounted on the second dielectric tube;

a first radio frequency (RF) power source configured to supply first power to the first antennas;

a second RF power source configured to supply second power to the second antenna; and a first power distributor disposed between the first antennas and the first RF power source to distribute to the first antennas the first power supplied by the first RF power source, wherein a value of an area of an outlet end portion of the exhaust pipe is the same as a value of a total area of the gas distribution holes of the baffle plate, and the pumping device is configured to control the pressure inside the chamber to be within a range of about 0.1 mTorr to about 1 Torr.

* * * * *